(12) United States Patent
Bassom

(10) Patent No.: US 8,759,788 B1
(45) Date of Patent: Jun. 24, 2014

(54) ION SOURCE

(71) Applicant: Varian Semiconductor Equipment Associates, Inc., Gloucester, MA (US)

(72) Inventor: Neil Bassom, Hamilton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/793,447

(22) Filed: Mar. 11, 2013

(51) Int. Cl.
*H01J 27/00* (2006.01)

(52) U.S. Cl.
USPC ... 250/424; 250/423 R; 250/427; 315/111.01; 315/111.21; 313/231.01; 313/231.31; 313/231.41

(58) Field of Classification Search
USPC ............... 250/423 R, 424, 427; 315/111.01, 315/111.21; 313/231.01, 231.31, 231.41
See application file for complete search history.

(56) References Cited

U.S. PATENT DOCUMENTS

| | | | | | |
|---|---|---|---|---|---|
| 2,928,966 | A | * | 3/1960 | Neidigh | 315/111.01 |
| 4,728,862 | A | * | 3/1988 | Kovarik et al. | 315/111.01 |
| 5,457,298 | A | * | 10/1995 | Nelson et al. | 219/121.52 |
| 6,765,216 | B2 | * | 7/2004 | Kagadei et al. | 250/423 R |
| 7,812,321 | B2 | | 10/2010 | Kurunczi et al. | |
| 7,838,850 | B2 | | 11/2010 | Hahto et al. | |
| 2009/0166554 | A1 | * | 7/2009 | Radovanov et al. | 250/424 |
| 2010/0148088 | A1 | * | 6/2010 | Radovanov et al. | 250/424 |
| 2013/0313443 | A1 | * | 11/2013 | Koo et al. | 250/427 |

OTHER PUBLICATIONS

Gushenets, V.I., et al., Self-heated hollow cathode discharge system for charged particle sources and plasma generators, Review of Scientific Instruments, 2010, pp. 1-3, vol. 81, No. 02B305-1, American Institute of Physics, Melville, New York, USA.

* cited by examiner

*Primary Examiner* — Michael Maskell

(57) ABSTRACT

In one embodiment an ion source includes an arc chamber and an emitter having a surface disposed in the arc chamber, where the emitter is configured to generate a plasma in the arc chamber. The ion source further includes a repeller having a repeller surface positioned opposite the emitter surface, and a hollow cathode coupled to the repeller and configured to provide a feed material into the arc chamber.

20 Claims, 4 Drawing Sheets

ION SOURCE

FIELD

This disclosure relates to ion implantation, and more particularly to improved ion sources used in ion implantation systems.

BACKGROUND

In high volume manufacturing processes including ion implantation for processing semiconductor substrates increasing ion current continues to be a priority. One ongoing challenge for ion sources is the ability to breakup and ionize molecular gases that are commonly used as a source of dopants to be implanted into substrates. A related problem is the efficiency of producing multiply charge ions from a precursor species. As is well known, in ion implantation systems multiply charged ions may be used as a means to increase ion implantation energy without increasing acceleration voltage. One particular challenge facing the industry is the ability to produce multiply charged dopant ions from molecular precursors. Commonly used ion sources, such as indirectly heated cathode sources may yield, for example, a higher fraction of singly charge ions than desirable.

Ionization of species to a multiply charged state generally proceeds through a stepwise process, in which the precursor molecule is first broken up into constituent neutral atoms. A neutral atom subsequently loses initially one electron as a result of collision with an electron, thereby forming a singly charged ion. The singly charged ion then loses a second electron in a collision with another electron, and so on. To increase the output of multiply charged ions it is desirable to increase the production rates of ions and decrease the loss rates for ions in the stepwise production process. In principle, this may be accomplished in various manners. For one, the energy of electrons in a plasma within the ion source may be increased. The degree of ionization may also be increased, meaning that the fraction of charged particles such as charged molecules to neutral molecules is increased. In addition, minimizing the rate of ion losses due to collisions with neutrals or chamber walls increases net ion production rate. However, in present day IHC ions sources for many ion species ion production is less than desired.

SUMMARY

In view of the above, it will be appreciated that there is a need to improve ion implantation apparatus, and in particular to develop ion source technology to increase the current generating capability in the ion source for multiply charge ions.

In one embodiment an ion source includes an arc chamber and an emitter having a surface disposed in the arc chamber, where the emitter is configured to generate a plasma in the arc chamber. The ion source further includes a repeller having a repeller surface positioned opposite the emitter surface, and a hollow cathode coupled to the repeller and configured to provide a feed material into the arc chamber.

In a further embodiment, a method of generating multiply charged ions in an ion source includes introducing feed material into an arc chamber of an ion source via a hollow cathode, the ion source including a repeller and an emitter, where the emitter has a surface disposed in the arc chamber, and the repeller is disposed opposite to the emitter. The method also includes energizing the emitter and emitting electrons therefrom to generate a plasma in the arc chamber, and energizing the hollow cathode and ionizing the feed material passing therethrough.

DETAILED DESCRIPTION

Figure 1:
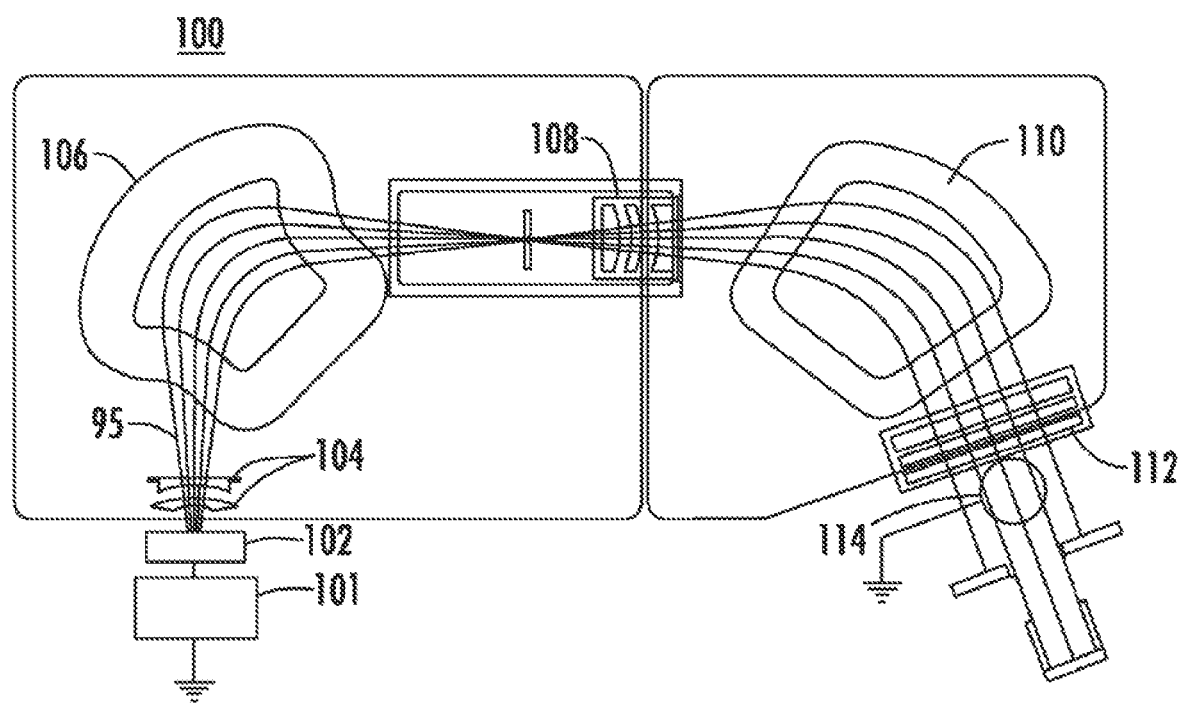
FIG. 1 depicts an ion implantation system consistent with various embodiments of the disclosure.

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Various embodiments involve apparatus and systems to produce high current ion sources. In some embodiments an ion source includes an indirectly heated cathode and hollow cathode that are interoperative to produce a plasma having higher concentration of multiply charged ions. The ion source may inject gas through the hollow cathode and into an ion source chamber. In operation, the hollow cathode is configured to decompose and excite gas such as molecular species as the gas is conducted into the ion source chamber. The hollow cathode is further configured to generate a supply of energetic electrons in the ion source chamber. These features facilitate generating a plasma within the ion source chamber that has enhanced concentration of multiply charged ions, thereby increasing ion current of multiply charged ions that can be extracted as an ion beam for processing a substrate.

Referring to the drawings, FIG. 1 is a block diagram of an embodiment of an ion implantation system 100 including an ion source 102 whose operation is detailed below. A power supply 101 supplies the required energy to source 102 which is configured to generate ions of a particular species. The generated ions are extracted from the source through a series of electrodes 104 (extraction electrodes) and formed into a beam 95 which is manipulated and directed to a substrate using various beam components 106, 108, 110, 112. After extraction, the beam 95 passes through a mass analyzer magnet 106. The mass analyzer is configured with a particular magnetic field such that only the ions with a desired mass-to-charge ratio are able to travel through the analyzer. Ions of the desired species pass through deceleration stage 108 to corrector magnet 110. Corrector magnet 110 is energized to deflect ion beamlets in accordance with the strength and direction of the applied magnetic field to provide a ribbon beam targeted toward a work piece or substrate positioned on support (e.g. platen) 114. In some cases, a second deceleration stage 112 may be disposed between corrector magnet 110 and support 114. The ions lose energy when they collide with electrons and nuclei in the substrate and come to rest at a desired depth within the substrate based on the acceleration energy.

Figure 2:
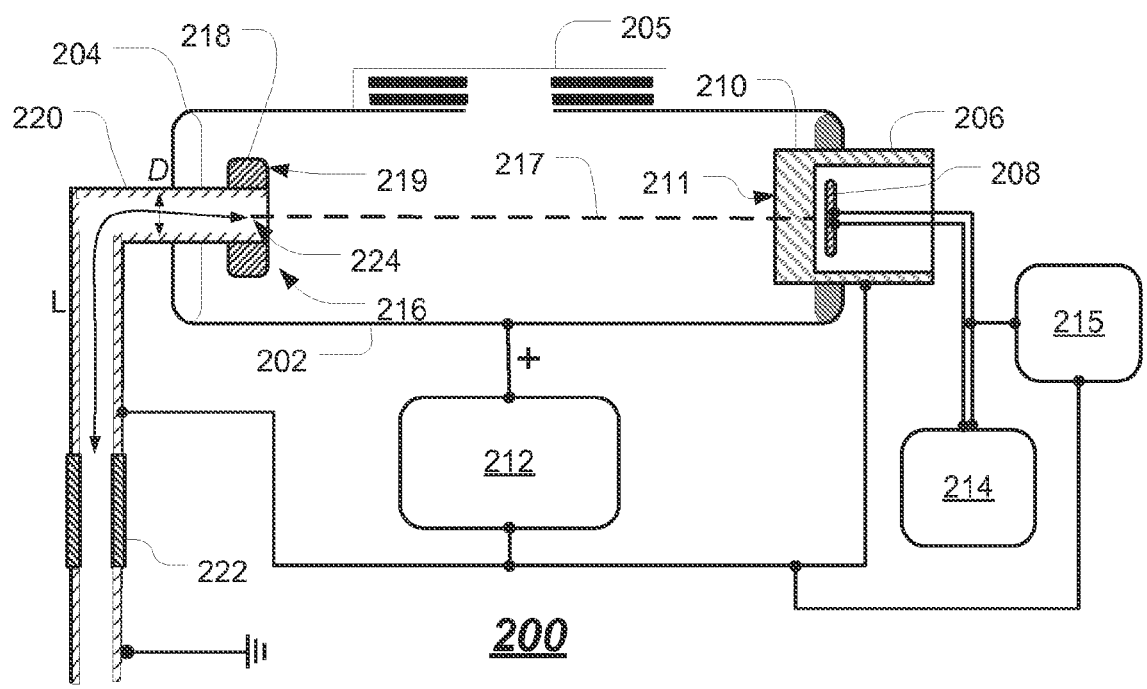
FIG. 2 depicts a composite diagram including a side-cross-sectional view of an ion source consistent with the present embodiments.

FIG. 2 depicts details of an ion source 200 consistent with an embodiment of the disclosure. The ion source 200 includes an arc chamber 202 that contains a discharge from which an ion beam may be extracted via the extraction assembly 205. The ion source 200 is equipped with an indirectly heated cathode 206 that is electrically isolated from the arc chamber 202 via insulating break 204, which may be an air gap. The indirectly heated cathode 206 may have a filament 208 and an emitter 210. The emitter 210 is connected to the negative terminal an arc power supply 212, whose positive terminal is connected to the ion source chamber. The indirectly heated cathode 206 is configured to generate a discharge in the arc chamber 202 when the arc power supply applies a bias between the arc chamber 202 and emitter 210, and when current is sent through the filament 208 by the filament power supply 214. As further shown in FIG. 2, the ion source 200 includes a bias power supply 215 having a negative terminal electrically connected to the filament 208. The bias supply 215 acts to apply a potential difference between the filament 208 and indirectly heated emitter 210, which causes electrons generated by the filament 208 to accelerate toward the indirectly heated emitter 210 generating heat in the indirectly heated emitter 210 in proportion to the electron energy acquired. Subsequently, electrons are emitted from the surface 211 of the emitter 210, which are effective in ionizing gas molecules admitted to the arc chamber 202.

In contrast to conventional ion sources, the ion source 200 also includes a hollow cathode assembly 216. In the present embodiment, the hollow cathode 216 is located opposite the emitter 210. The hollow cathode assembly 216 includes a repeller portion (also termed "repeller") 218 and hollow cathode 220. The repeller portion 218 may be constructed from conventional repeller material such as tungsten or graphite. In the present embodiment, the repeller portion 218 and hollow cathode 220 may be coupled with one another such that when a voltage signal is applied to either the repeller portion 218 or hollow cathode 220, both portions attain the same potential. In other embodiments, the repeller portion 218 may be spaced apart from the hollow cathode 220 and/or biased independently. In various embodiments the port end 224 of the hollow cathode 220 is located at a repeller surface 219 of the repeller 218. In some embodiments, as shown in FIG. 2, the repeller portion 218 circumferentially surrounds the hollow cathode 220 at port end 224 such that the port end 224 forms an aperture in the repeller surface 219. The repeller surface 219 may be used to reflect electrons emitted from the surface 211 of the emitter 210 when the appropriate potential is applied to the hollow cathode assembly 216. In some embodiments, as shown in FIG. 2, the hollow cathode assembly 216 and IHC share a common axis, which may be the axis 217 of the arc chamber 202.

The hollow cathode 220 is configured to conduct a feed material such as a gas or vapor into the arc chamber 202 so as to ignite a hollow cathode discharge that facilitates generation of desired ion species in the arc chamber 202 as detailed below with respect to FIG. 4. The feed material may include a species to be implanted into a substrate and/or a dilutant. As detailed below, in operation the hollow cathode 220 is configured to perform one or more of multiple operations, including breaking down of feed material such as molecular gas species into smaller fragments such as atoms, the ionizing of feed material such as gas species, and/or the generation of electrons that travel into the arc chamber 202. Consistent with the present embodiments, suitable feed material includes one or more of boron (B), carbon (C), phosphorous (P), arsenic (As), hydrogen (H), and fluorine (F).

In the embodiment of FIG. 2, the hollow cathode 220 is electrically connected to the arc power supply 212. The hollow cathode may be fabricated from a conductive material that serves in part as a gas feed line to the arc chamber 202. A cylindrical tube insulator 222 is provided to isolate the hollow cathode 220 from grounded tube portions that may be coupled to the supply of gas (not shown).

Figure 3:
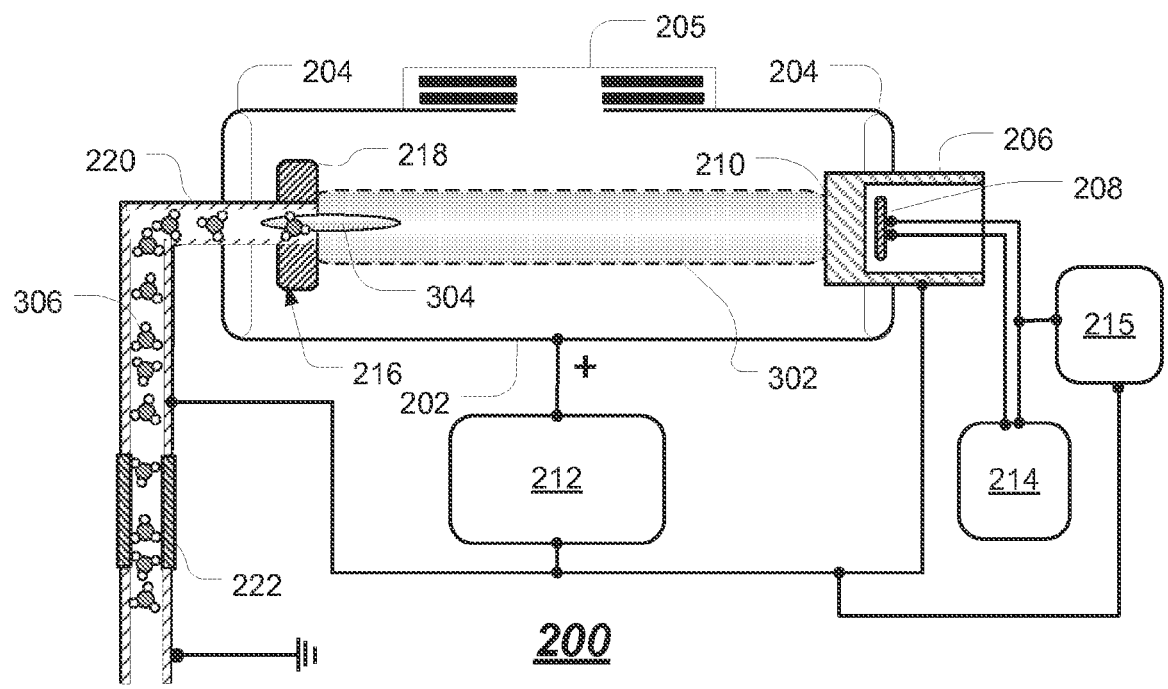
FIG. 3 depicts one instance of operation of the ion source of FIG. 2.

FIG. 3 depicts one example of operation of the ion source 200. In the instance shown in FIG. 3, the ion source 200 generates an enhanced discharge 302 that is configured to generate increased multiply charged ion current. Gas species 306 are conducted through the hollow cathode 220 and exit through the port end 224 (shown in FIG. 2) into the arc chamber 202. In various embodiments, the gas flow rate ranges from about 0.5-200 sccm, which gas flow rate encompasses those flow rates typically employed in conventional IHC ion sources. In various embodiments, the diameter of hollow cathode 220 ranges from about 1 mm to several cm or larger.

In the present disclosure, the length L of the hollow cathode 220 is typically greater than six times the diameter D of the hollow cathode 220. In the operation of FIG. 3, the hollow cathode 220 is maintained at an electrical potential several tens to hundreds of volts lower than a potential of the arc chamber 202. Under such conditions certain locations within the hollow cathode 220 may fulfill the condition that the gas pressure multiplied by the hollow cathode diameter D is equal to about 1 torr·cm, at which point electrical breakdown of the gas species 306 can take place. Electrons that are generated in the hollow cathode 220, can then reflect back and forth from the walls inside the hollow cathode 220, ionizing gas molecules of the gas species 306 as the electrons continue to reflect on the inside of hollow cathode 220. This produces the narrow discharge 304 that extends into the arc chamber 202 are provides a source of electrons and ions to the (main) discharge 302.

The temperature of the hollow cathode 220 can rise such that thermionic emission of electrons from the inner walls of the hollow cathode starts and a self-sustaining plasma is formed within the hollow cathode 220 as discussed below with respect to FIG. 4. In some embodiments, the tube may be heated by a wire heater (not shown) if self-heating is insufficient. In typical operation, the repeller portion 218 attains an elevated temperature and external heating of the hollow cathode is not required.

Figure 4:
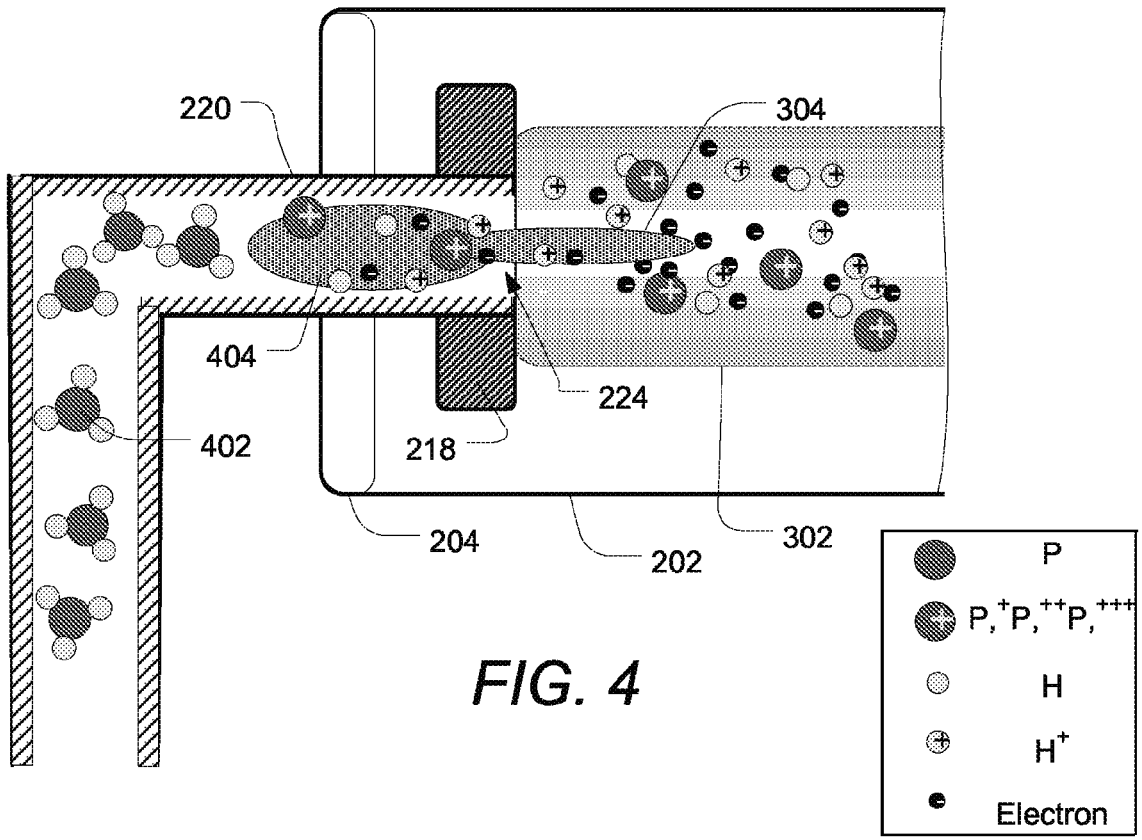
FIG. 4 depicts details of the operation depicted in FIG. 3.

FIG. 4 depicts details of formation of an enhanced discharge according to various embodiments. Only a portion of the arc chamber 202 is illustrated, not including the indirectly heated emitter 210. In this example, gas is conducted into the arc chamber 202 via the hollow cathode 220 as discussed above with respect to FIG. 3. Merely for the purposes of illustration the gas 402 is depicted as molecular gas, which may be $PH_3$ in one example. As the $PH_3$ molecules are conducted towards the port end 224, which leads to the arc chamber 202, the hollow cathode 220 generates electrons as discussed previously. The electrons generated in the hollow cathode 220 lead to the creation within the hollow cathode 220 of a discharge portion 404 of the narrow discharge 304 as well as the portion of the narrow discharge 304 that extends from the hollow cathode 220 as discussed previously. The discharge portion 404 causes a breakdown of the molecular gas, such as $PH_3$ which may yield products such as P, H, as well as generating phosphorous and hydrogen ions, and electrons. As illustrated in FIG. 4, the phosphorous ions may include singly charged, doubly charged, and triply charged ions.

In some examples the hollow cathode 220 may generate up to several amps additional electron current in comparison to the electron current generated by an IHC ion source operating without the hollow cathode. For example, in some embodiments the hollow cathode 220 may generate up to five amps additional electron current. Moreover the hollow cathode 220 generates an electron energy of electrons injected into the arc chamber 202 approximately that of the hollow cathode voltage. This energy may be substantially higher than electron energy of electrons generated in a conventional IHC ions source.

In particular, the hollow cathode 220 may generate an arc current sufficient to yield a plasma carrier density of $5 \times 10^{13}$ to $2 \times 10^{14}/cm^3$ which exceeds typical plasma density yielded by a conventional IHC ion source. The narrow discharge 304 and enhanced discharge 302 are therefore particularly effective for multiple reasons in generating a higher yield of multiply charged ions as opposed to conventional IHC ion sources. For one, the higher electron densities present in the narrow discharge 304 and enhanced discharge 302 increases the likelihood that a neutral species may undergo multiple collisions with electrons before being neutralized in collisions with the walls of the arc chamber 202 or being extracted from the arc chamber 202. This, in turn, increases the likelihood of forming a multiply charge ion in the aforementioned stepwise ionization process. Moreover, the electron energy for electrons generated from the hollow cathode 220 may be higher than in conventional IHC ion sources, further increasing the probability of creating multiply charged ions. For example, a potential of up to several hundred volts may be applied to the hollow cathode 220, which generates a comparable electron energy in electrons injected by the hollow cathode into the arc chamber 202. This energy is sufficient to induce multiple ionization in species such as phosphorous, having $1^{st}$, 2nd and $3^{rd}$ ionization potentials of roughly 10, 20, and 30 eV, respectively.

In some embodiments, the end of the hollow cathode 220 from which the narrow discharge 304 is created may be capped such that a cap (not shown) has an aperture or orifice that has a smaller diameter than the diameter D of the hollow cathode 220. This may facilitate operation of the hollow cathode 220 at a higher pressure for a given flow rate of gas through the hollow cathode.

Figure 5:
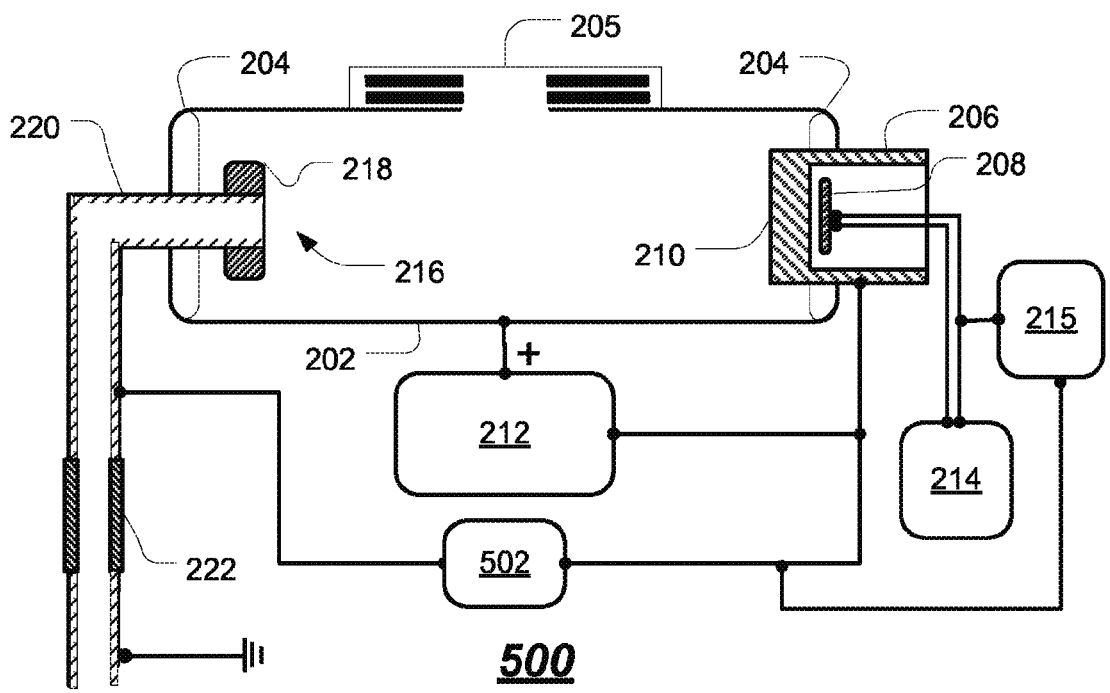
FIG. 5 illustrates a side cross-sectional view of another ion source according to further embodiments of the disclosure.

FIG. 5 depicts an additional embodiment of an ion source 500 that includes a separate hollow cathode power supply 502 coupled to the IHC to independently bias hollow cathode with respect to the IHC. This facilitates the tuning of electron energy of electrons injected by the hollow cathode 220, which may be used to increase yield of multiply charged ions according to the ionization behavior of a species to be ionized, as discussed above. For example, in this embodiment the hollow cathode power supply 502 may apply a voltage of 100 V, which yields an electron energy of about 100 eV for electrons injected by the hollow cathode 220, which may be substantially higher than the electron energy of electrons emitted by the indirectly heated cathode 206.

Figure 6:
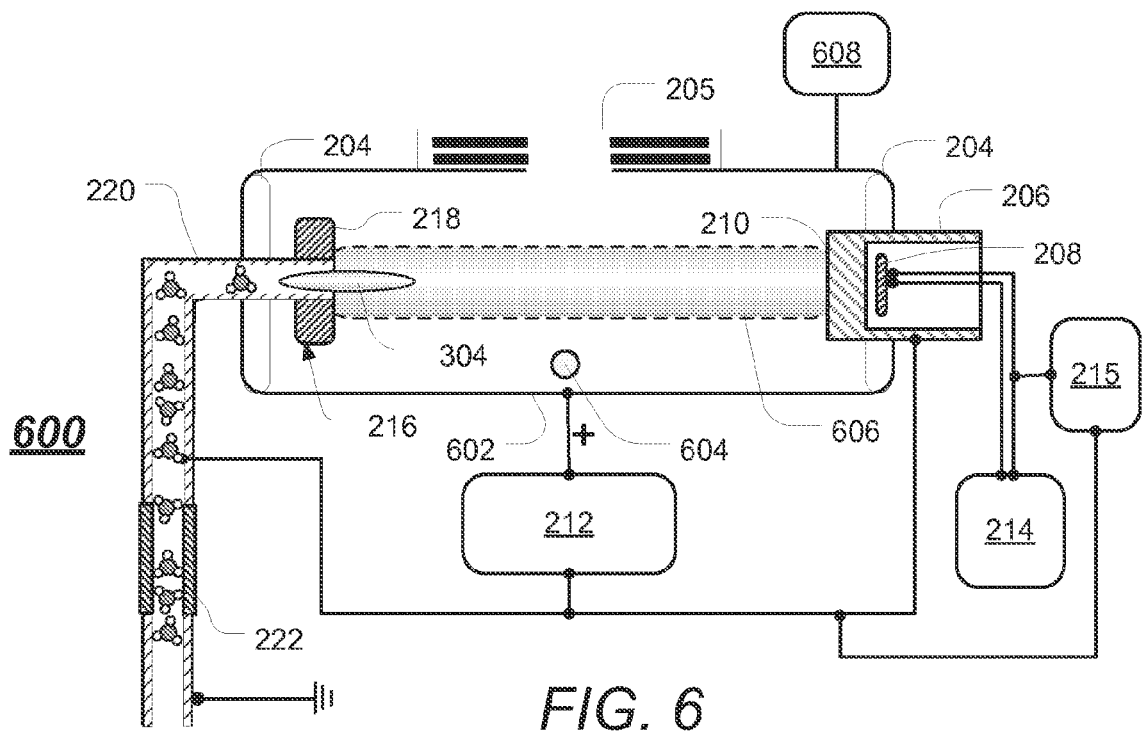
FIG. 6 illustrates a side cross-sectional view of another ion source in one mode of operation according to further embodiments of the disclosure.

In various additional embodiments, an ion source includes a port spaced apart from the hollow cathode to provide gas directly to the arc chamber separately from gas conducted through the hollow cathode. FIG. 6 depicts an ion source 600 having a gas port 604 located in a central portion of the arc chamber 602. In some embodiments, the gas port 604 may direct a different gas than the gas provide through the hollow cathode 220. For example, $PH_3$ may be provided through the hollow cathode 220 while a different gas is provided through the gas port 604. In other embodiments, the ion source may be configured to flow the same gas through the gas port 604 and hollow cathode 220. In some embodiments, the ion source 600 may be configured to switch between providing gas through the hollow cathode 220 alone, the gas port 604 alone and both hollow cathode 220 and gas port 604. As further shown in FIG. 6, a gas flow controller 608 is provided, which may be configured to direct gas to flow only thought the gas port 604 in a first setting, to direct gas to flow only through the hollow cathode 220 in a second setting, and to direct gas to flow through both the gas port 604 and hollow cathode 220 in a third setting. In the particular example shown in FIG. 6, gas is provided through the gas port 604 and through the hollow cathode 220, thereby generating the discharge 606, which is an enhanced discharge that comprises a higher current due to the injection of electrons from the hollow cathode 220.

Figure 7:
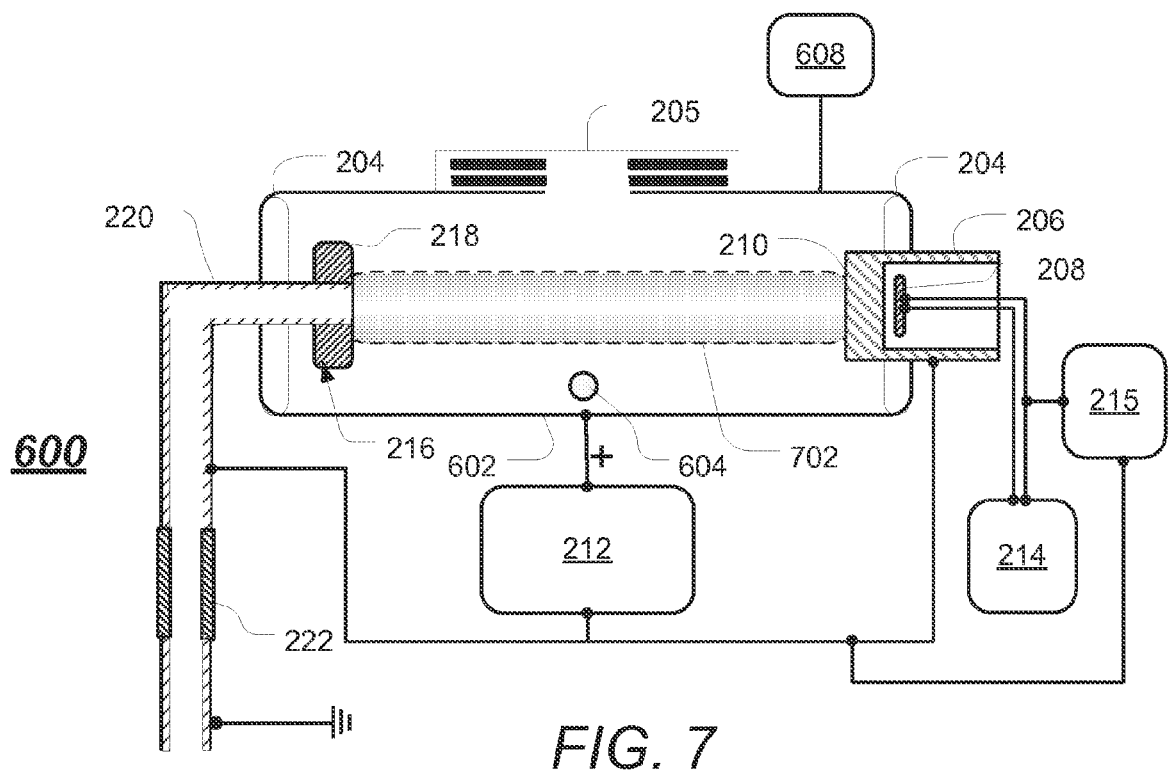
FIG. 7 illustrates a side cross-sectional view of the ion source of FIG. 6 during another mode of operation.

Turning now to FIG. 7, there is shown another instance of operation of the ion source 600 in which gas is provided solely through the gas port 604. In this case, the hollow cathode 220 is unenergized such that no discharge is developed within the hollow cathode and the discharge 702 is thereby not enhanced by emission from the hollow cathode 220.

Although not illustrated in the FIGs., it is to be noted that in the aforementioned embodiments of ions sources a magnet may be provided to generate a magnetic field along the axis 217, as is typically the case in conventional IHC sources. Fortuitously, operation of the ion source of the present embodiments under a typical magnetic field strength of 100 Gauss or so may increase stability of operation of the hollow cathode assembly.

In summary, the present embodiments integrate in a novel manner a hollow cathode into an ion source chamber that includes an indirectly heated cathode. This provides advantages over conventional IHC ion sources including the generation of higher electron current and higher electron energy in the ion source discharge. Another advantage is the ability to achieve a higher degree of atomization of molecular species, as well as the ability to generate a greater amount of multiply charge ion species for a given precursor gas. A further advantage is that the hollow cathode may be located within a repeller structure thereby avoiding the need to extensively reconfigure existing IHC ion source designs.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

What is claimed is:
1. An ion source, comprising:
an arc chamber;
an emitter having a surface disposed in the arc chamber, the emitter configured to generate a plasma in the arc chamber;
a repeller having a repeller surface positioned opposite the emitter surface; and a hollow cathode coupled to the repeller and configured to provide a feed material into the arc chamber, wherein the hollow cathode is configured to generate a discharge within the hollow cathode when the hollow cathode is maintained at an electrical potential several tens to hundreds of volts lower than a potential of the arc chamber.

2. The ion source of claim 1, wherein the hollow cathode is configured to ionize the feed material passing therethrough.

3. The ion source of claim 1, wherein the repeller surface is disposed around the hollow cathode.

4. The ion source of claim 2, wherein the hollow cathode further comprises an insulating member disposed between the hollow cathode and a gas feed line configured to provide the species to the hollow cathode.

5. The ion source of claim 2, wherein the hollow cathode further comprises an aperture disposed near an end of the hollow cathode, the aperture having diameter smaller than that of a diameter of the hollow cathode.

6. The ion source of claim 2, wherein the hollow cathode comprising a diameter of about 1-10 mm.

7. The ion source of claim 1, further comprising:
a first power supply configured to supply a bias voltage to bias the ion source chamber with respect to the emitter; and a
a second power supply coupled to the hollow cathode and configured to bias the repeller and hollow cathode with respect to the emitter.

8. The ion source of claim 1, wherein the hollow cathode is configured to provide up to five amps electron current into the plasma.

9. The ion source of claim 1, further comprising a port spaced apart from the hollow cathode and configured to provide to the arc chamber the feed material at a position spaced apart from the hollow cathode.

10. The ion source of claim 1, wherein the emitter and hollow cathode are interoperative to generate, when the hollow cathode is energized, a first concentration of multiply charged ions in the ion source chamber that is greater than a second concentration of the multiply charged ions generated by the emitter alone.

11. The ion source of claim 1, wherein the hollow cathode is operative to generate a plasma carrier density of about $5 \times 10^{13}/cm^3$ to $2 \times 10^{14}/cm^3$.

12. An ion implantation system, comprising:
an ion source including:
an arc chamber;
an emitter having a surface disposed in the arc chamber, the emitter configured to generate a plasma in the arc chamber;
a repeller having a repeller surface positioned opposite the emitter surface; and
a hollow cathode coupled to the repeller and configured to provide a feed material into the arc chamber, wherein the hollow cathode is configured to generate a discharge within the hollow cathode when the hollow cathode is maintained at an electrical potential several tens to hundreds of volts lower than a potential of the arc chamber; and
a support positioned downstream of the ion source and configured to support a substrate.

13. The ion implantation system of claim 12, further comprising:
an extraction assembly configured to extract ions from the arc chamber; and
beam-line components configured to direct the ions to the substrate.

14. The ion implantation system of claim 12, wherein the hollow cathode is configured to ionize the feed material passing therethrough.

15. The ion implantation system of claim 12, wherein the repeller surface is disposed around the port end of the hollow cathode.

16. The ion implantation system of claim 12, wherein the emitter and hollow cathode are interoperative to generate when the hollow cathode is energized a first concentration of multiply charged ions in the ion source chamber that is greater than a second concentration of multiply charged ions generated by the emitter alone.

17. The ion implantation system of claim 12, further comprising:
a port spaced apart from the hollow cathode and configured to provide to the arc chamber the feed material at a position spaced apart from the hollow cathode; and
a controller configured to provide the feed material into the arc chamber via at least one of the hollow cathode and the port.

18. The ion implantation system of claim 17, wherein the feed material comprises at least one of boron (B), carbon (C), phosphorous (P), arsenic (As), hydrogen (H), and fluorine (F).

19. A method of generating multiply charged ions in an ion source, comprising:
introducing feed material into an arc chamber of an ion source via a hollow cathode, the ion source including a repeller and an emitter, the emitter having a surface disposed in the arc chamber, the repeller disposed opposite to the emitter;
energizing the emitter and emitting electrons therefrom to generate a plasma in the arc chamber; and
energizing the hollow cathode and ionizing the feed material passing therethrough, wherein the ionizing the feed material comprises generating a discharge inside the hollow cathode by maintaining the hollow cathode at an electrical potential several tens to hundreds of volts lower than a potential of the arc chamber.

20. The method of claim 19, further comprising biasing the hollow cathode to a negative potential with respect to the ion source chamber.

* * * * *